United States Patent
Kwon et al.

(10) Patent No.: US 8,122,199 B2
(45) Date of Patent: Feb. 21, 2012

(54) MULTI PORT MEMORY DEVICE WITH SHARED MEMORY AREA USING LATCH TYPE MEMORY CELLS AND DRIVING METHOD

(75) Inventors: Jin-Hyoung Kwon, Seongnam-si (KR); Kyung-Woo Nam, Seoul (KR); Han-Gu Sohn, Suwon-si (KR); Ho-Cheol Lee, Suji-eup (KR); Kwang-Myeong Jang, Hwaseong-si (KR)

(73) Assignee: Samsung Electronics Co. Ltd., Suwon-Si, Gyeonggi-Do (KR)

( * ) Notice: Subject to any disclaimer, the term of this patent is extended or adjusted under 35 U.S.C. 154(b) by 368 days.

(21) Appl. No.: 12/392,432

(22) Filed: Feb. 25, 2009

(65) Prior Publication Data

US 2009/0254698 A1    Oct. 8, 2009

(30) Foreign Application Priority Data

Feb. 27, 2008  (KR) .................... 10-2008-0017589

(51) Int. Cl.
  *G06F 12/00*    (2006.01)
(52) U.S. Cl. ........ 711/149; 711/103; 711/105; 711/147; 711/163

(58) Field of Classification Search .................. None
  See application file for complete search history.

(56) References Cited

U.S. PATENT DOCUMENTS

| | | | |
|---|---|---|---|
| 7,870,326 B2 * | 1/2011 | Shin et al. | 711/5 |
| 2003/0093628 A1 * | 5/2003 | Matter et al. | 711/153 |
| 2007/0171755 A1 | 7/2007 | Oh et al. | |
| 2008/0046665 A1 * | 2/2008 | Kim | 711/149 |

FOREIGN PATENT DOCUMENTS

KR    100715525 B1    4/2007

* cited by examiner

*Primary Examiner* — Shawn X Gu
(74) *Attorney, Agent, or Firm* — Volentine & Whitt, PLLC

(57) ABSTRACT

A multiport semiconductor memory device includes; first and second port units respectively coupled to first and second processors, first and second dedicated memory area accessed by first and second processors, respectively and implemented using DRAM cells, a shared memory area commonly accessed by the first and second processors via respective first and second port units and implemented using memory cells different from the DRAM cells implementing the first and second dedicated memory areas, and a port connection control unit controlling data path configuration between the shared memory area and the first and second port units to enable data communication between the first and second processors through the shared memory area.

15 Claims, 8 Drawing Sheets

MULTI PORT MEMORY DEVICE WITH SHARED MEMORY AREA USING LATCH TYPE MEMORY CELLS AND DRIVING METHOD

CROSS-REFERENCE TO RELATED PATENT APPLICATION

This application claims priority under 35 U.S.C. §119 to Korean Patent Application 10-2008-0017589 filed on Feb. 27, 2008, the subject matter of which is hereby incorporated in its entirety by reference.

BACKGROUND

Semiconductor memory devices are employed to store data in a great variety of host systems. In some system systems, simultaneous data input/output (I/O) through multiple data access ports may be required.

One type of semiconductor memory device having two access ports is called a dual-port memory. Dual-port memories are commonly used in a number of fields, such as digital image processing to store data. In such applications, dual-port memories may be known as "video memory" and have a RAM port accessible via a random sequence and a Shared Memory Area (SAM) port accessible only via a serial sequence.

In contrast with such dual-port (or video) memories, regular dynamic random access memories (DRAM) do not include a SAM port associated with a shared memory area. Rather, DRAM comprises a memory cell array accessible via by different processors through a plurality of access ports. To distinguish this type of memory device from dual-port (or video) memories, they will hereafter be referred to as multi-port memories or multipath accessible memories. One example of a conventional memory device having a shared memory area and being adapted for use in a multiprocessor system, (i.e., adapted for access by a plurality of processors) is disclosed in published U.S. Patent Application 2003/0093628. FIG. 1 is a block diagram of the multiprocessor system 50 described in the U.S. Patent Application 2003/0093628.

Referring to FIG. 1, an array of memory cells 35 includes first, second and third portions. First portion 33 of memory array 35 may be accessed by only a first processor 70 via a first port 37. Second portion 31 of memory array 35 may be accessed by only a second processor 80 via a second port 38, and third portion 32 may be accessed by either one of the first and second processors 70 and 80. The respective size of first and second portions 33 and 31 of memory array 35 is changeable depending on the operating load of first and second processors 70 and 80. Having this access architecture, memory array 35 is referred to as "a memory type or disk storage type" array.

To realize third portion 32 commonly accessed by first and second processors 70 and 80 within the memory array 35 using DRAM components and access techniques, a number of technical issues must be addressed. As a first issue, the layout of the respective memory areas within memory array 35 must be considered. Next, adequate read/write path control techniques associated with the respective access ports must be considered. Further, the inevitable pressure to expand third portion 32, as the overall data storage capacities of the memory array 35 are increased must be addressed.

SUMMARY

Embodiments of the invention relate to multiport semiconductor memory devices. More particularly, embodiments of the invention relate to multiport semiconductor memory devices incorporating a shared memory area capable of being accessed via a multipath and implemented using a latch type memory cell. Embodiments of the invention also relate to a multiprocessor system using this type of memory device. Thus, certain embodiments of the invention provide an improved multiport semiconductor memory device and a multiprocessor system employing same. Embodiments of the invention also provide a driving method for a multiport semiconductor memory device capable of resolving certain overhead problems associated with a defined chip size and the structure of a given shared memory area.

In one embodiment, the invention provides a multiport semiconductor memory device comprising; first and second port units respectively coupled to first and second processors, a first dedicated memory area accessed by only the first processor via the first port unit and implemented using Dynamic Random Access Memory (DRAM) cells, a second dedicated memory area accessed by only the second processor via the second port unit and implemented using DRAM cells, a shared memory area commonly accessed by the first and second processors via respective first and second port units and implemented using memory cells different from the DRAM cells implementing the first and second dedicated memory areas, and a port connection control unit controlling data path configuration between the shared memory area and the first and second port units to enable data communication between the first and second processors through the shared memory area.

In another embodiment, the invention provides a multiprocessor system comprising; a first processor performing a first task, a second processor performing a second task; and a multiport semiconductor memory device comprising; first and second port units respectively coupled to the first and second processors, a first dedicated memory area accessed by only the first processor via the first port unit and implemented using Dynamic Random Access Memory (DRAM) cells, a second dedicated memory area accessed by only the second processor via the second port unit and implemented using DRAM cells, a shared memory area commonly accessed by the first and second processors via respective first and second port units and implemented using memory cells different from the DRAM cells implementing the first and second dedicated memory areas, and a port connection control unit controlling data path configuration between the shared memory area and the first and second port units to enable data communication between the first and second processors through the shared memory area.

In another embodiment, the invention provides a method of driving a multiport semiconductor memory device in a multiprocessor system including the multiport semiconductor memory device operationally coupled with first and second processors individually performing first and second tasks, the method comprising; preparing in the multiport semiconductor memory device, first and second port units individually coupled corresponding to the first and second processors, dedicated memory areas accessed dedicatedly by the processors corresponding to the port units and comprised of DRAM cells, and a shared memory area accessed in common by the processors through the port units, comprised of memory cells of a type different from the dedicated memory areas and assigned in a predetermined memory capacity unit at a portion of memory cell array, forming a data access path between the shared memory area and one port selected from the port units in response to external signals applied from the processors, and using an internal register accessed corresponding to a specific address of the shared memory area to provide a DRAM interface function in a communication between the processors.

BRIEF DESCRIPTION OF THE DRAWINGS

Embodiments of the invention will be described in some additional detail with reference to the accompanying drawings.

DESCRIPTION OF EMBODIMENTS

Embodiments of the present invention now will be described in some additional detail with reference to FIGS. 2 through 8. The present invention may, however, be embodied in many different forms and should not be construed as being limited to only the illustrated embodiments. Rather these embodiments are provided as teaching examples.

Unless otherwise defined, all terms (including technical and scientific terms) used herein have the same meaning as commonly understood by those skilled in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

A multiport semiconductor memory device having a shared memory area implemented with latch-type memory cells and a multiprocessor system employing it, and a driving method of the multiport semiconductor memory device, are described as follows in the context of certain embodiments of the invention.

Figure 1:
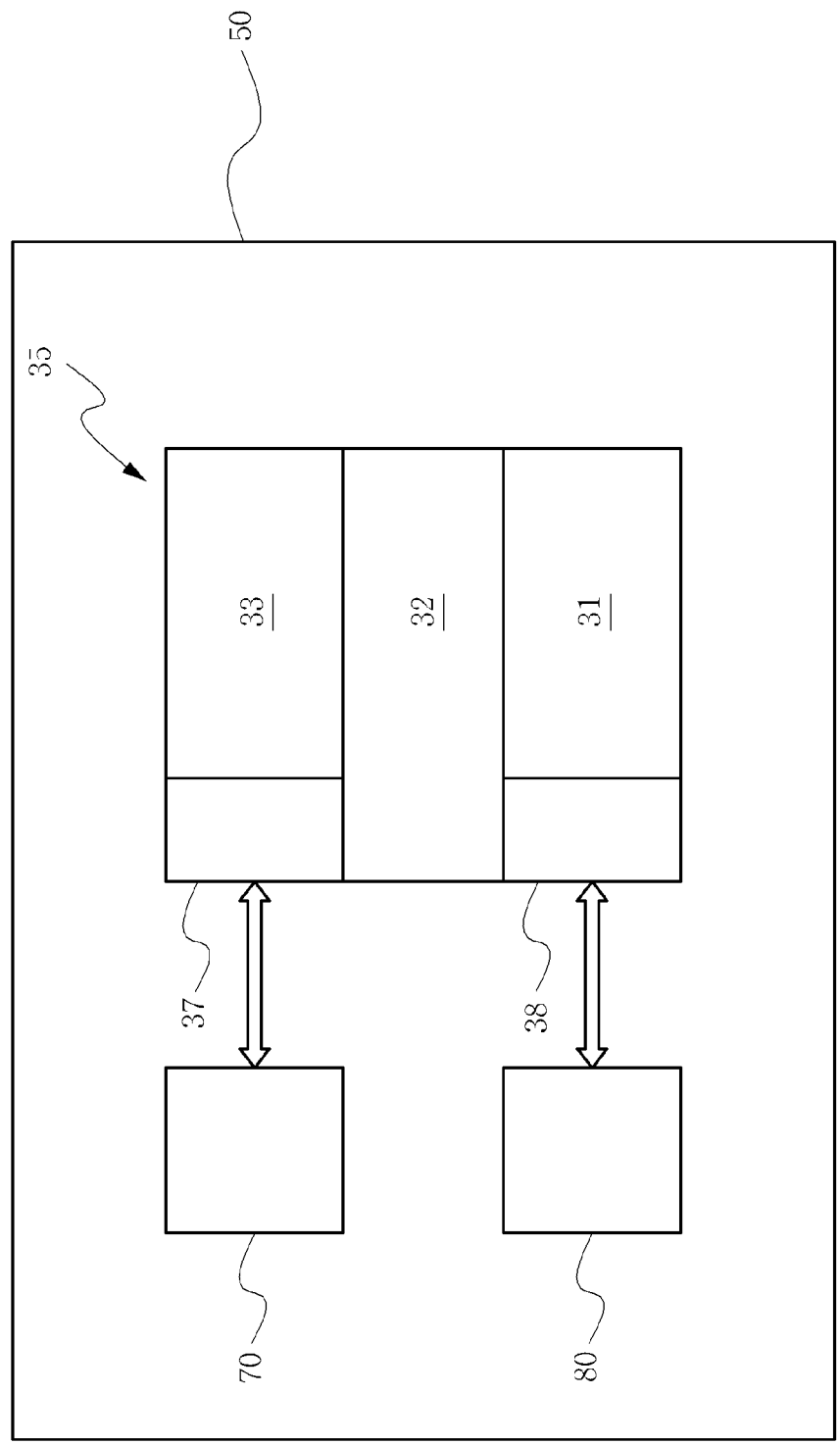
FIG. 1 is a block diagram of a conventional multiprocessor system.

One possible architecture for certain embodiments of the invention will be described in relation to FIGS. 2 and 3. Unlike the conventional multiprocessor system described in relation to FIG. 1, a multiprocessor system according to an embodiment of the invention may be used to effectively provide a multimedia device having the general architecture shown in FIG. 2.

Figure 2:
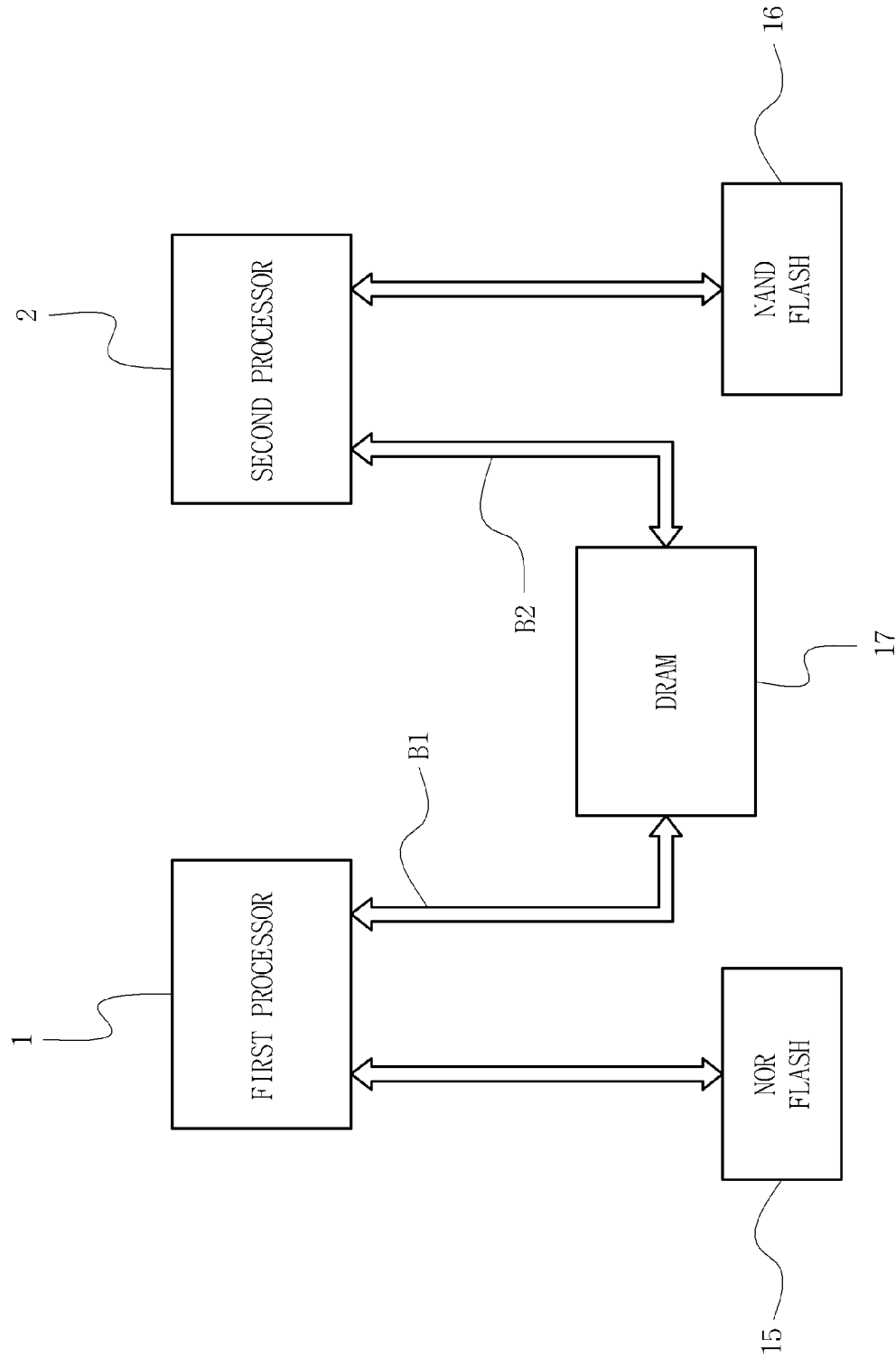
FIG. 2 is a block diagram illustrating a schematic connection structure for a multiprocessor system according to an embodiment of the invention.

FIG. 2 is a conceptual block diagram illustrating a schematic connection structure of components within a multiprocessor system. The exemplary system of FIG. 2 comprises two processors, one DRAM and two flash memories. This type of multiprocessor system may be employed, for example, in a mobile communication device, such as a handheld phone.

Within this illustrated embodiment, DRAM 17 is assumed to be a multi port semiconductor memory device, such as a "oneDRAM" type device manufactured by Samsung Electronics, Co. Ltd. That is, DRAM 17 has multiple ports and is shared by first and second processors 1 and 2 within the multiprocessor system. First processor 1 is a MODEM processor performing a number of conventional tasks, such as communication signal modulation/demodulation. Second processor 2 is a generic application processor performing such tasks as video/audio processing, game application execution, etc.

NOR flash memory 15 and NAND flash memory 16 are respectively coupled to first and second processors 1 and 2. As is understood in the art, NOR flash memory 15 and NAND flash memory 16 are nonvolatile memory devices well adapted to storage of critical data that must be retained in the system during periods when power is not applied. Examples of such critical data include; application program, boot codes and user input data for handheld devices.

Multiport DRAM 17 functions as a main memory for data processing operations performed by processors 1 and 2. As illustrated in FIG. 2, multiport DRAM 17 is accessed via two respective "access paths" (i.e., electrical connection circuits) by first and second processors 1 and 2. That is, data I/O ports and corresponding memory banks within multiport DRAM 17 are respectively connected to system buses B1 and B2 associated with first and second processors 1 and 2. Such a configuration using multiple, respective ports is different from the access configuration of a conventional DRAM having only a single I/O port.

The oneDRAM type device assumed within the illustrated embodiment is a fusion type memory device capable of greatly increasing data processing speed between a communication processor and a media processor within a mobile device. Conventionally, the operation of two processors requires two distinct memory devices or two data buffers. However, the oneDRAM is able to effectively route data between two processors using a single memory device. Thus, the conventional need for two memory buffers may be eliminated. Further, the oneDRAM may greatly reduce the time required to communicate data between processors by applying a dual-port data access approach. In this manner, a single oneDRAM may replace at least two mobile memory chips within a high-performance smart-phone and similar multimedia enabled handset. As the data processing speed between processors increases, the oneDRAM may reduce power consumption by as much as 30 percent, and reduce the total die area required for memory by about 50 percent. As a result, the operating speed of the constituent mobile host device may be increased by as much as five times while the battery life may be extended and the overall size of the handset is reduced.

Figure 3:
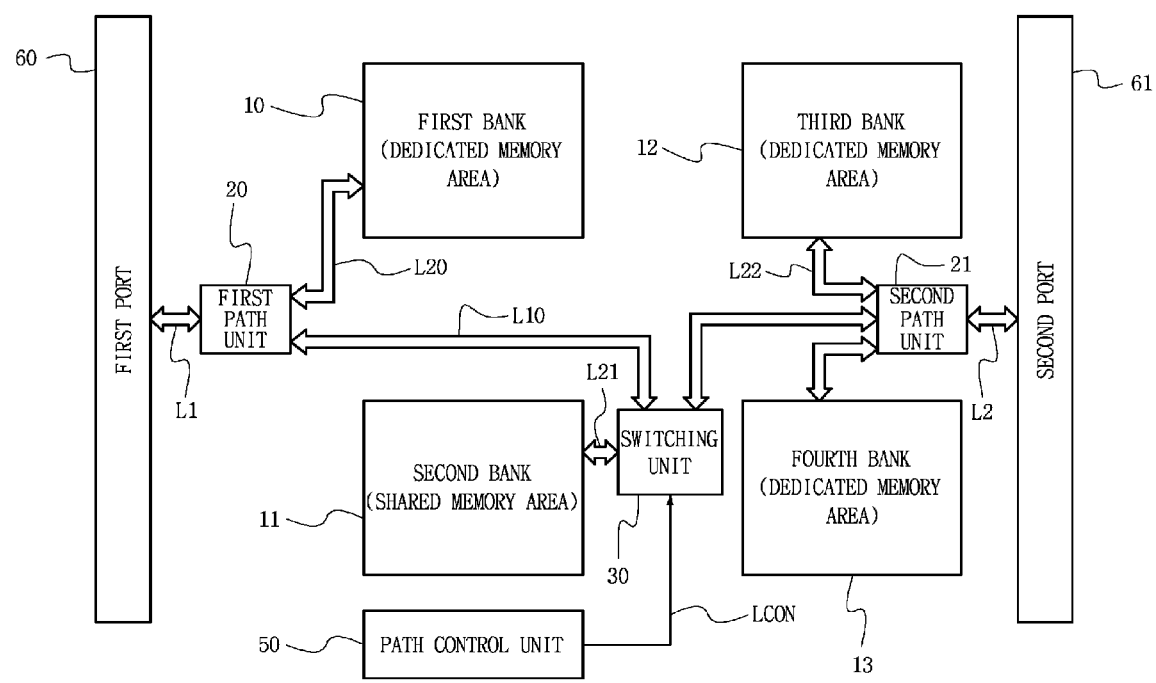
FIG. 3 is a block diagram further illustrating certain functional components of the multiport semiconductor memory device of FIG. 2.

FIG. 3 is a block diagram further illustrating the functional circuits of the multiport semiconductor memory device of FIG. 2. In the illustrated embodiment, four (4) areas (or "memory banks") of the memory cell array are assumed within DRAM 17. A first bank 10 is dedicated for access by first processor 1 via first port 60. Third bank 12 and fourth bank 13 are dedicated for access by second processor 2 via second port 61. In contrast, second bank 11 may be accessed by either one of first and second processors 1 and 2 via respective first and second ports 60 and 61. As a result, within the constituent memory cell array of the multiport semiconductor device, second bank 11 is designated as a shared memory area, while first, third and fourth banks 10, 12 and 13 are designated as respective dedicated memory areas.

In the illustrated embodiment, second bank 11 is operationally coupled to first port 60 under the control of a path controller 50 which provides a path control signal (LCON) to a switching unit 30. Switching unit 30 connects a second signal line L21 associated with second bank 11 to a first switching signal line L10 associated with a first path unit 20. (In this context, it should be noted that the term "line" encompasses not just single signal lines and conventionally associated components, but also signal bus structures including more than one signal line and associated components). First path unit 20 connects a first switching signal line L10 to a first port signal line L1 associated with first port 60. In this manner, first processor 1 may access second bank 11 or first bank 10. In similar vein and using analogous components as illustrated in FIG. 3, second processor 2 may access either third bank 12 or fourth bank 13. When first processor 1 is not accessing second bank 11, second processor 2 may access second bank 11.

However, within a multiprocessor system having this configuration the size of the shared memory area tends to grow to point where it negatively impacts the size of the overall memory device. For example, assuming the data storage capacity for each memory bank is 1024 Mb, the data storage for the shared memory area will also typically be 1024 Mb. However, this default "same-size as the dedicated memory banks" approach will result in a commonly accessed memory bank that is much larger than necessary.

Thus in one aspect, embodiments of the invention provide a commonly accessed memory device in which dedicated memory areas are implemented in conventional DRAM memory cells, but the shared memory area is implemented using a different type of memory cells. In this manner, the size of the memory bank implementing the shared memory area need not expand with the expansion of the dedicated memory banks.

Figure 4:
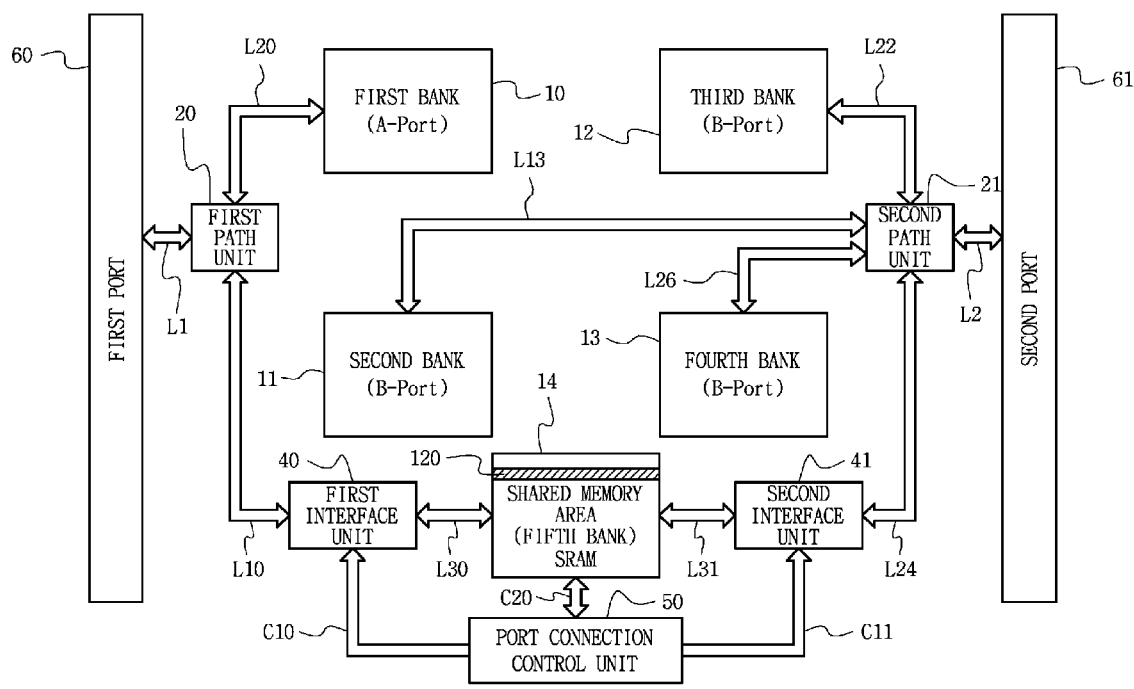
FIG. 4 is a block diagram illustrating a multiport semiconductor memory device according to an embodiment of the invention.

FIG. 4 is a conceptual block diagram illustrating a multiport semiconductor memory device according to an embodiment of the invention.

Referring to FIG. 4, a shared memory area 14 implemented using a latch type memory cell, such as those commonly found in a Static Random Access Memory (SRAM) device, is additionally provided within the multiport semiconductor memory device 17 of FIG. 4, as compared with the memory device of FIG. 3.

Thus, in the illustrated embodiment of FIG. 4, five (5) memory banks are used to implement the operative memory cell array. In this configuration, first bank 10 is a dedicated memory area 10 accessed by first processor 1 via first port 60. Second bank 11, third bank 12, and fourth bank 13 are dedicated memory areas accessed by second processor 2 via second port 61. In the illustrated embodiment, it is assumed that the dedicated memory areas 10, 11, 12 and 13 are implemented using conventional DRAM memory cells. That is, the four dedicated memory areas 10, 11, 12 and 13 may be individually configured as a memory bank unit of a DRAM, where each bank may has a data storage capacity of 16 Mb (Megabit), 32 Mb, 64 Mb, 128 Mb, 256 Mb, 512 Mb, 1024 Mb, etc.

In contrast, a fifth bank configured to operate as shared memory area 14 has a connection structure that allows access by first and second processors 1 and 2 via first and second ports 60 and 61, and first and second interface units 40 and 41. Consequently, fifth bank 14 may be implemented using an SRAM device, such that the memory cells implementing the shared memory area are of a different type (i.e., static latch type verses volatile DRAM type) than those implementing the dedicated memory areas.

Within the foregoing configuration, shared memory area 14 may be implemented in bank unit of SRAM having any reasonable size, (i.e. a bank size selected from a group of bank sizes including 16 Mb, 32 Mb, 64 Mb, 128 Mb, 256 Mb, 512 Mb or 1024 Mb, etc.). Notwithstanding the unit bank size of shared memory area 14, the unit bank size of dedicated memory areas 10, 11, 12 and 13 may be independently determined at the discretion of the system designer. For example, in one possible configuration the unit bank size for the shared memory area 14 is 64 Mb and the unit bank size of each dedicated memory area 10, 11, 12 and 13 is 512 Mb.

First and second ports 60 and 61 shown in FIG. 4 are port units and are respectively coupled to a corresponding processor.

Port connection control unit 50 controls data path configurations between shared memory area 14 and port units 60 and 61 to allow data transmission/reception between the processors through shared memory area 14.

Figure 5:
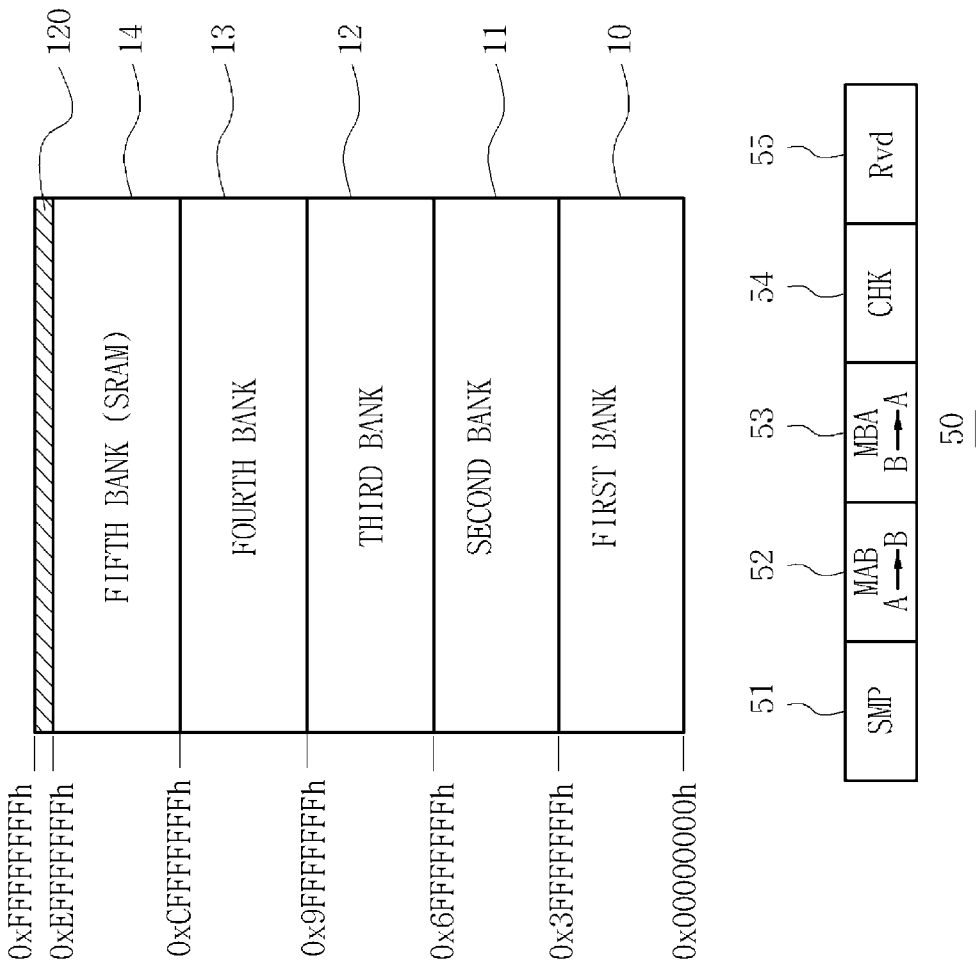
FIG. 5 is a conceptual diagram illustrating address assignment and access relationships for exemplary memory banks associated with the port connection control unit of FIG. 4.

As shown in one possible embodiment illustrated in FIG. 5, port connection control unit 50 may comprise an internal register accessed substitutionally outside the memory cell array in place of a specific area 120 of shared memory area 14 when a specific address to access the specific area 120 of the shared memory area 14 is applied, the internal register being for storing data necessary for a control of the data path.

First and second interface units 40 and 41 are individually coupled to shared memory area 14 via first and second interface lines L30 and L31, serve to convert DRAM address/data into SRAM address/data, and implement data I/O interface operations. That is, first and second interface units 40 and 41 collectively enable the I/O interface (or data switching) to shared memory area 14 in response to control signals applied from port connection control unit 50 through control signal line C20.

Activation of first and second interface units 40 and 41 is controlled by first and second activation control signals applied through first and second activation control lines C10 and C11 provided by port connection control unit 50. That is, when first processor 1 coupled to first port 60 accesses shared memory area 14, first port line L1, first switching line L10, and first interface line L30 are collectively operated in relation to first path unit 20, first interface unit 40, by port connection control unit 50.

In FIG. 4, first path unit 20 basically functions as a switching element between first port line L1 and a selected one of first signal line L20 and first switching line L10. As further illustrated in FIG. 7, first path unit 20 may be implemented using a multiplexer and driver circuit.

Figure 7:
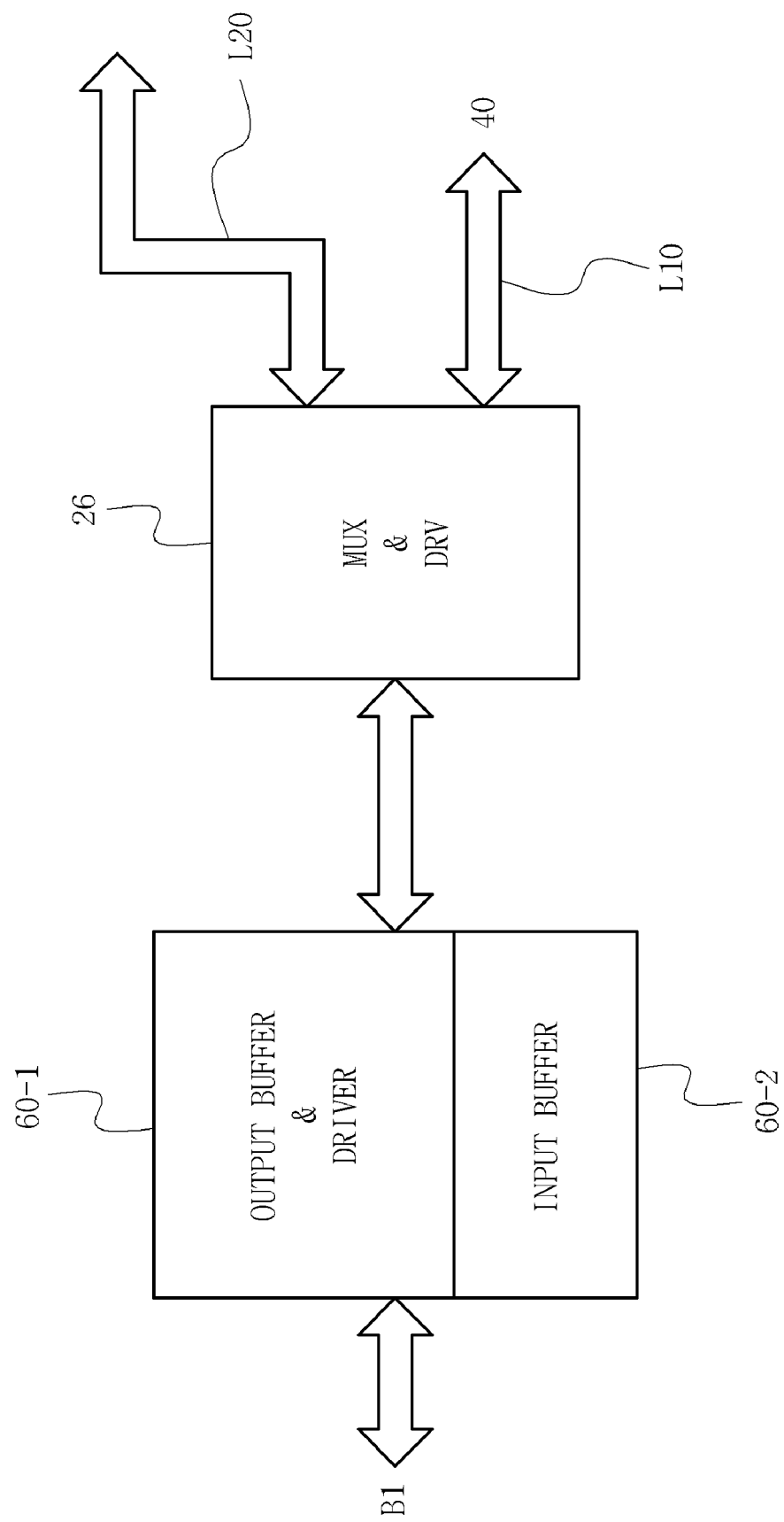
FIG. 7 illustrates a connection example between a first port unit and a first path unit shown in FIG. 4.

Similarly, second path unit 21 basically function as a switching element between second port line L2 and a selected one of second signal line L13, third signal line L22, fourth signal line L26, and second switching signal line L24. It may be similarly configured as first path unit 20, as shown in FIG. 7.

First processor 1 is assumed in the illustrated embodiment to function as a MODEM processor, while second processor 2 is assumed to function as an application processor.

FIG. 5 further illustrates an address assignment and an access relation for memory banks and a port connection control unit shown in FIG. 4.

Referring to FIG. 5, respective first through fourth banks 10-13 are assumed to have a capacity of 16 Mb, while the fifth bank 14 is implemented using memory cells in disable area 120. That is, a specific row address (0xEFFFFFFFh~0xFFFFFFFFh, 2 KB size=1 row size) enabling one optional row of the shared memory area 14 constructed of SRAM is changeably assigned to port connection control unit 50 functioning as an interface unit. Port connection control unit 50 basically comprises internal register 50. Then, when the specific row address (0xEFFFFFFFh~0xFFFFFFFFh) is applied, a corresponding specific word line area 120 of shared memory area 14 is disabled, but internal register 50 is enabled.

As a result, in one aspect of certain embodiments of the invention, a semaphore area 51 and mailbox areas 52 and 53 may be accessed using a direct address mapping method. Further, a command identifying a corresponding disabled address is decoded to map an address associated with a register adapted outside a memory cell array. Thus, the memory controller of an enabling chip set may generate a command directed to this area using exactly the same approaches used for commands directed to the other memory cells.

In FIG. 5, in first and second mailbox areas 52 and 53, messages transmitted between the first and second processors, (i.e., authority request, address, data size, transmission data indicating an address of shared memory having the storage of data, or commands, etc.), may be written. That is, in first mailbox area 52, a message transmitted from first processor 1 to second processor 2 may be written, and in second mailbox area 53 a message transmitted from second processor 2 to first processor 1 may be written.

Semaphore area 51, first mailbox area 52, and second mailbox area 53 may each be 16 bits wide, and a corresponding check bit area 54 may be 4 bits wide. An additional reserve area 55 may be 2 bits wide.

Areas 51, 52, 53, 54 and 55 may be enabled in common by the specific row address and are individually accessed by an applied column address.

Internal register 50 constituting the port connection control unit is a data storage area adapted separately from the memory cell array to get an interfacing between processors. Internal register 50 may be accessed by each of the first and second processors, and may be implemented using a flip-flop type data latch. That is, the semaphore area and the mailbox areas may be implemented using static latch type memory cells different from the (refresh-required) DRAM memory cells implementing the dedicated memory banks.

For example, when a data interface between the first and second processors 1 and 2 is realized using multiport DRAM 17, first and second processors 1 and 2 are able to write messages back and forth using mailboxes 52 and 53. A processor receiving a message first recognizes the sending processor and performs a corresponding operation.

As described above, when the multiple processors perform data communication using first and second mailboxes 52 and 53, a host interface overhead may be substantially reduced or completely eliminated. This allows the overall system structure to become more compact, and to operate with greater efficiency. Therefore, a processor that is not directly coupled to a flash memory may nonetheless indirectly access the flash memory via multiport DRAM 17 of the foregoing embodiments.

Figure 6:
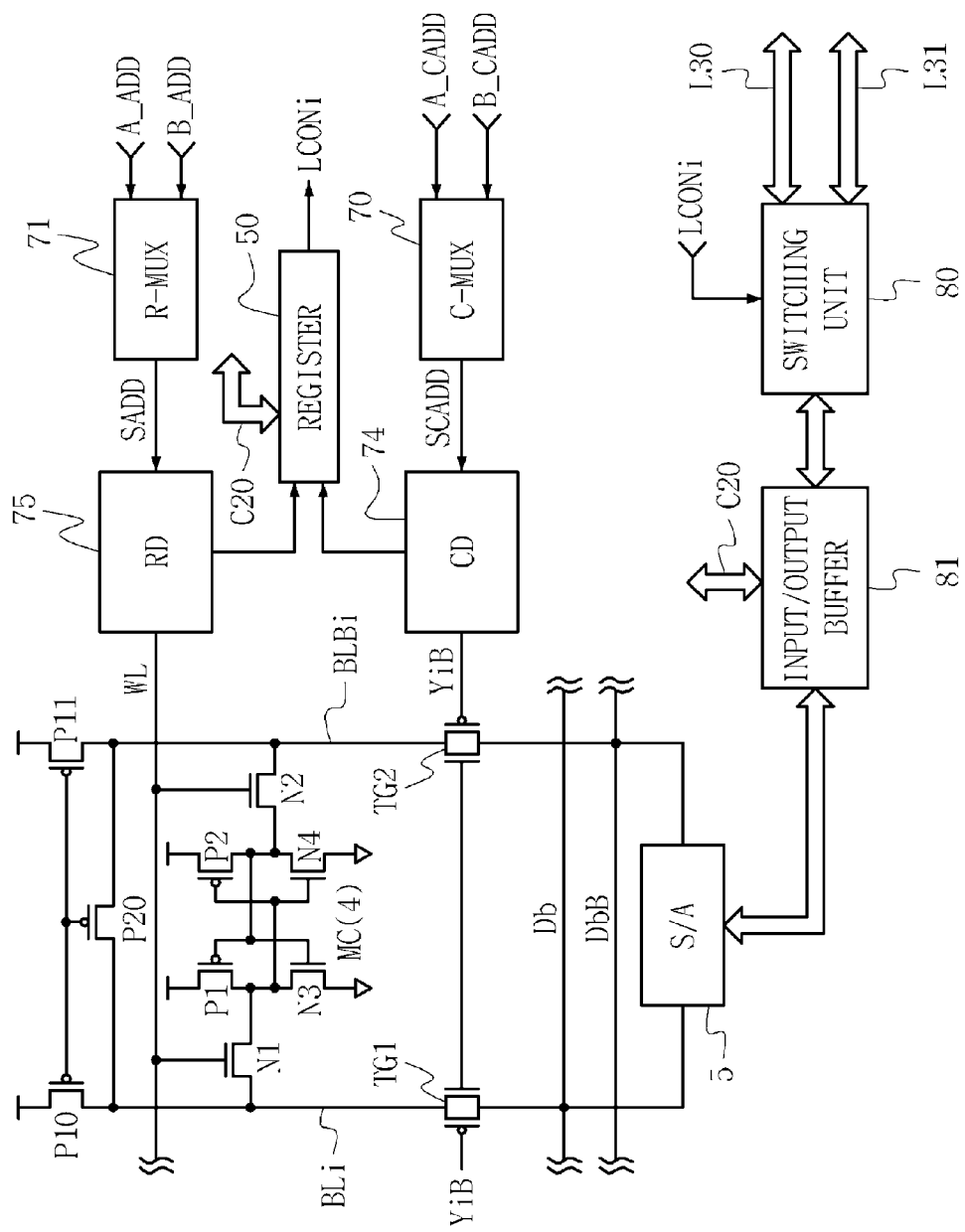
FIG. 6 further illustrates one example of multipath access to a shared memory area of FIG. 4.

FIG. 6 further illustrates one example of multipath access to the shared memory area of FIG. 4. FIG. 7 illustrates a connection example between first port unit 60 and first path unit 20 of FIG. 4.

In FIG. 6, a memory cell 4 as a unit cell element of a memory bank is an optional memory cell belonging to the shared memory area 14 of FIG. 4. The memory cell 4 is a full CMOS SRAM cell comprised of P-type and N-type MOS transistors N1, N2, N3, N4, P1 and P2. The P-type transistors P10, P11 and P20 perform a precharge and equalizing function. Transmission gates TG1 and TG2 serve as operationally connecting a selected bit line pair BLi, BLBi to a data line pair Db, DbB in response to a column selection signal Yib. A sense amplifier 5 performs a well-known function of sensing and amplifying a minute potential difference between the data line pair Db, DbB so as to decide data stored in a memory cell.

The SRAM cell 4 is coupled to intersections of a plurality of word lines and a plurality of bit lines, forming a bank array of a matrix type. A word line WL shown in FIG. 6 is disposed between a gate of access transistor N1, N2 of the SRAM cell 4 and a row decoder 75. The row decoder 75 applies a row-decoded signal to the word line and internal register 50 in response to a selection row address SADD of row address multiplexer 71. A bit line BLi constituting a portion of bit line pair is coupled between a column selection gate TG1 and a drain of the access transistor N1. A complementary bit line BLBi is coupled between a column selection gate TG2 and a drain of the access transistor N2. The column selection gates TG1 and TG2 are enabled in response to a column decoded signal of a column decoder 74. The column decoder 74 produces the column-decoded signal in response to a selection column address SCADD of a column address multiplexer 70, and applies it to the column selection gates TG1 and TG2 and the internal register 50.

In FIG. 6, the sense amplifier 5 is coupled to an I/O buffer 81, and I/O buffer 81 is coupled to a switching unit 80. The I/O buffer 81 is coupled to one of the lines L30 and L31 through a switching operation of the switching unit 80.

In a data read operating mode, a potential developed to the bit line pair BLi, BLBi is transferred to the data line pair Db, DbB. The sense amplifier 5 senses and amplifies a minute potential difference appearing between the data line pair Db, DbB, and thus data of memory cell output by the sense amplifier 5 is applied to I/O buffer 81. The data buffered through I/O buffer 81 is provided to the switching unit 80. Read data output from the switching unit 80 performing a switching function is transferred to an output buffer and driver 60-1 of first port 60 through a multiplexer and driver 26 constituting a first or second path unit as shown in FIG. 7. When shared memory area 14 has been accessed by first processor 1, second processor 2 will not be coupled to second interface line L31 or second switching line L24. That is, an access operation by second processor 2 to shared memory area 14 is cut off, but second processor 2 may yet access any one of dedicated memory areas 11, 12 and 13.

On the other hand, during a write operation, write data applied through an input buffer 60-2 of first port 60 is transferred to the data line pair Db, DbB sequentially through the multiplexer and driver 26 of FIG. 7, switching unit 80, I/O buffer 81 and sense amplifier 5 of FIG. 6. When the column selection gates TG1 and TG2 are activated, the write data is transferred to the bit line pair BLi, BLBi, and stored in a selection memory cell 4.

The output buffer and driver 60-1 and the input buffer 60-2 shown in FIG. 7 may correspond to or be included in the first port 60 of FIG. 4. Further, the multiplexer and driver of FIG. 7 may correspond to or be included in the first path unit 20 of FIG. 4. The multiplexer and driver prevents one processor from simultaneously accessing shared memory area 14 and dedicated memory area 10.

As described above, in a semiconductor memory device consistent with certain embodiments of the invention, two processors may commonly access shared memory area 14, thereby realizing a data communication function through a DRAM interface between said processors.

Figure 8:
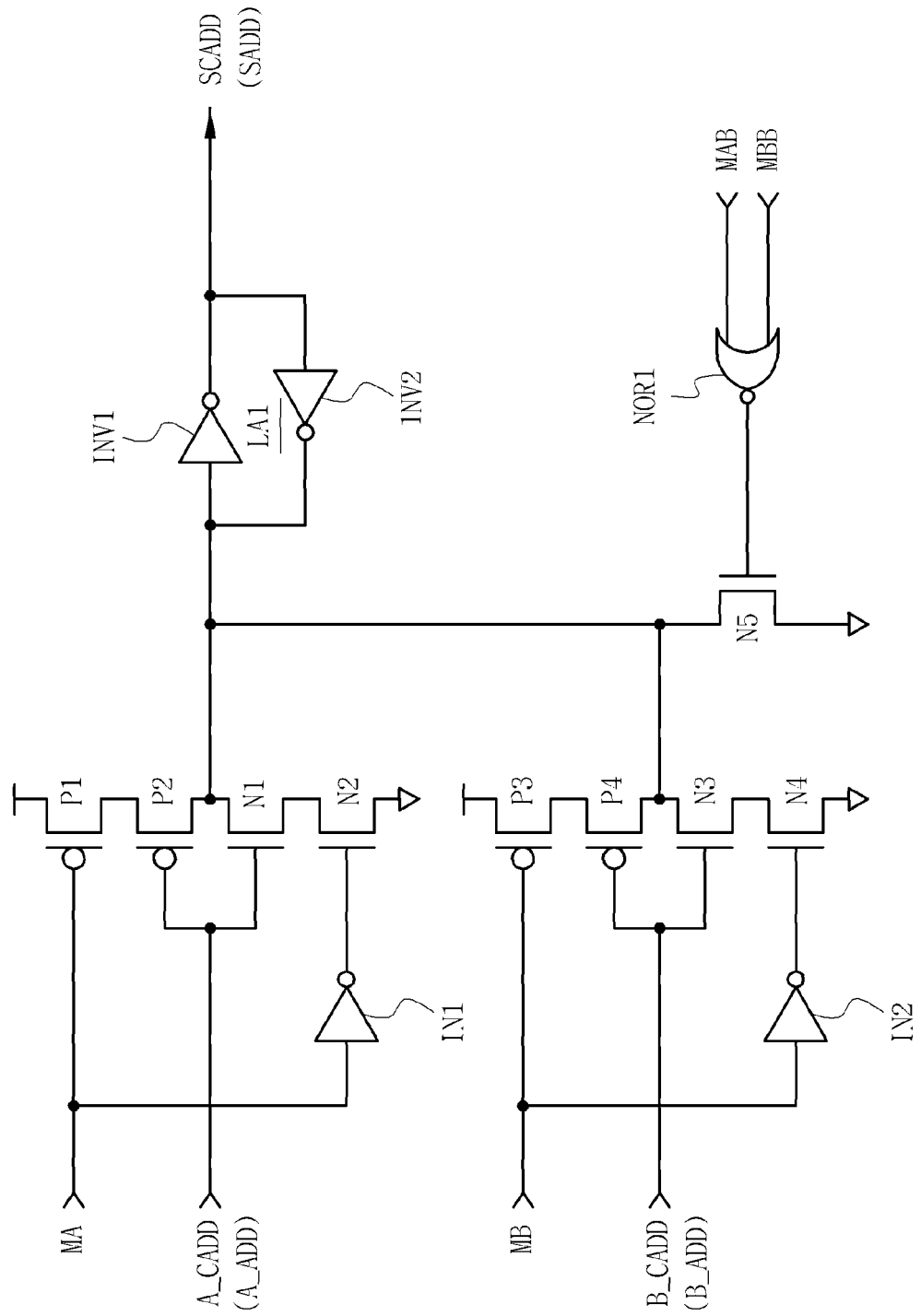
FIG. 8 is a circuit diagram illustrating in detail an example of an address multiplexer shown in FIG. 6.

FIG. 8 is a circuit diagram further illustrating one possible embodiment for the address multiplexer shown in FIG. 6. Address multiplexer shown in FIG. 8 may be used to implement row address multiplexer 71 and/or column address multiplexer 70 of FIG. 6. That is, one address multiplexer is obtained by the same circuit devices, and this functions as a row address multiplexer or column address multiplexer according to a kind of input signals.

The column address multiplexer 70 comprises clocked-CMOS inverters comprised of PMOS and NMOS transistors P1-P4 and N1-N4, and an inverter latch LA1 comprised of inverters INV1 and INV2, to receive two respective column addresses A_CADD and B_CADD provided through two ports, to two input terminals thereof, and to select one of two inputs according to a logic state of path decision signal MA, MB and thus output it as a selection column address SCADD. An NMOS transistor N5 and a NOR gate NOR1 are adapted to provide a discharge path between an input terminal of the inverter latch LA1 and a ground. The inverters IN1 and IN2 are adapted to each invert a logic state of the path decision signal MA, MB.

In FIG. 8, for example, when the path decision signal MA is applied with a logic low level, column address A_CADD applied through first port 60 is inverted through an inverter comprised of PMOS and NMOS transistors P2 and N1 and is again inverted through the inverter INV1 and then is output as the selection column address SCADD. However, in this circumstance, the path decision signal MB is applied with a logic high level, thus column address B_CADD, which may be applied through the second port 61, is not provided to an input terminal of the latch LA1 because the inverter comprised of PMOS and NMOS transistors P4 and N3 has an inactive state. As a result, column address B_CADD, which may be applied through the second port 61, is not output as the selection column address SCADD. Further, in FIG. 8, when an output of the NOR gate NOR1 becomes a high level, the NMOS transistor N5 is turned on and a logic level latched to the latch LA1 is reset to a low level.

One additional operational example for accessing shared memory area 14 implemented in an embodiment of the invention using SRAM memory cells accessed by first and second processors 1 and 2 through a DRAM interface is described hereafter with reference to FIGS. 4 through 8.

Referring to FIG. 4, when a memory storage of shared memory area 14 is smaller (by design) than that of first or third bank 10 or 12 and is comprised of an SRAM cell, the overall chip size may be reduced as compared with a case wherein the shared memory area is comprised of a large capacity of DRAM cell memory. In addition, the SRAM memory cell area need not be refreshed, but may be controlled by the same DRAM address mapping table used by the first and second processors.

In FIG. 4, for example, when first processor coupled to first port 60 is a processor performing a first task, i.e., operation such as a communication modulation/demodulation function, it may be assumed that second processor coupled to second port 61 is an application processor performing a second task, i.e., function of processing multimedia information.

Then, when first processor 1 has control authority over the shared memory area 14 and accesses data stored in the shared memory area 14, a data channel that sequentially connects between the first port 60, a first path unit 20, a first interface part 40 and shared memory area 14 is formed. That is, switching unit 80 of FIG. 6 operationally connects second interface line L31 to I/O buffer 81 through a path control of the port connection control unit 50, such that shared memory area 14 may be accessed by first processor 1. In this case, flag data "0" indicating that first processor 1 has control authority is apparent in semaphore area 51, as described in relation to FIG. 5. At this time, second processor 2 may not access shared memory area 14, but may yet access any one of dedicated memory areas 11, 12 and 13.

First processor 1 having the control authority may write call-data or image data of a corresponding party applied through a communication network, to a storage area of the shared memory area 14. When a write command and an address are applied like writing data to a memory cell of DRAM in a write operation, the first interface part 40 of FIG. 4 performs a converting operation with command and address of SRAM cell and thus the call data or image data is stored in the SRAM memory cell.

When the write operation of the first processor is completed, message is written to a mailbox 52 of FIG. 5. Here the message may be a data size of the written data, start address and end address for the written data, and a command requiring a data processing.

Therefore, second processor 2 reads the first mailbox 52 and then writes a signal to second mailbox 53 indicating that the message has been read. Then, first processor 1 performs a transfer operation of a control authority, and after that, changes the flag data of the semaphore area 51 to "1". Second processor now has control authority over shared memory area 14.

Second processor 2 accesses the data to compress the data in a predetermined data compression format or process the data. When the data processing operation of second processor 2 is complete, a message is written to second mailbox 53. Here the message may be the size of the resulting compressed data, a start address, and/or an end address, and/or a corresponding command requiring data transmission. Thus, first processor 1 may read the contents of second mailbox 53 and write a signal to first mailbox 52 accessed by first processor 1 indicating that the message has been read. After that, the flag data of the semaphore area 51 is again changed to "0" and the first processor regains control authority over shared memory area 14.

As described above, a design burden in configuring a shared memory area can be reduced by adequately using the shared memory area 14 comprised of an SRAM cell. Further, an SRAM cell area not requiring a refresh is controlled as a DRAM address mapping table by processors.

In a multiprocessor system according to some embodiments of the invention, the number of processors may increase to three or more. In the multiprocessor system, the processor may be a microprocessor, CPU, digital signal processor, micro controller, reduced-command set computer, complex command set computer, or the like. It is noted herein that an inventive scope is not limited to the number of processors referred above within the system. Further, the inventive scope is not limited to any particular combination of processors in adapting mutually equal or different processors.

It will be apparent to those skilled in the art that modifications and variations can be made in the present invention without deviating from the scope of the following claims. Thus, it is intended that the present invention cover any such modifications and variations provided they come within the scope of the appended claims and their equivalents. For example, in other cases, a configuration of shared memory bank of multiport semiconductor memory, or circuit configuration and access method thereof, may be varied diversely. A data path control to control a data path between a shared memory area and port units may be realized through various ways. Additionally, though a shared memory area has been exampled above as being constructed of an SRAM cell, it may be extendedly applied to other nonvolatile memories such as PRAM etc. without deviating from the inventive spirit. Accordingly, these and other changes and modifications are seen to be within the scope as defined by the appended claims.

In the drawings and specification, there have been disclosed embodiments of the invention and, although specific terms are employed, they are used in a generic and descriptive sense only and not for limitation, the inventive scope being set forth in the following claims.

What is claimed is:

1. A multiport semiconductor memory device comprising:
   first and second port units respectively coupled to first and second processors;
   a first dedicated memory area accessed by only the first processor via the first port unit and implemented using Dynamic Random Access Memory (DRAM) cells;
   a second dedicated memory area accessed by only the second processor via the second port unit and implemented using DRAM cells;
   a shared memory area commonly accessed by the first and second processors via respective first and second port units and implemented using Static Random Access Memory (SRAM) cells;
   a port connection control unit controlling data path configuration between the shared memory area and the first and second port units to enable data communication between the first and second processors through the shared memory area; and
   first and second interface units respectively coupled to the shared memory area, the first interface unit connecting the first port unit with the shared memory area and the second interface unit connecting the second port unit with the shared memory area, wherein each of the first and second interface units converts DRAM address/data compatible with data storage in the first and second dedicated memory areas into SRAM address/data compatible with data storage in the shared memory area.

2. The device of claim 1, wherein the port connection control unit comprises an internal register accessed outside a memory cell array implementing the first and second dedicated memory areas by a range of addresses identifying a specific area of the shared memory area, wherein the internal register stores data necessary for configuration of a respective data path by the port connection control unit.

3. The device of claim 2, wherein the internal register comprises a semaphore area storing data indentifying control authority over the shared memory area, a first mailbox area storing message data communicated from the first processor to the second processor, and a second mailbox area storing message data communicated from the second processor to the first processor.

4. The device of claim 1, wherein the first and second dedicated memory areas have a data storage capacity corresponding to a predetermined memory bank size.

5. A multiprocessor system comprising:
   a first processor performing a first task;
   wherein the first processor performs a first task and the second processor performs a second task.

6. The system of claim 5, wherein the first task comprises a communication modulation/demodulation function.

7. The system of claim 6, wherein the second task comprises a multimedia information processing function.

8. The system of claim 7, wherein the multiprocessor system is a mobile phone.

9. The system of claim 5, further comprising:
   a NAND type flash memory accessed by the second processor.

10. The device of claim 5, wherein the port connection control unit comprises an internal register accessed outside a memory cell array implementing the first and second dedicated memory areas by a range of addresses identifying a specific area of the shared memory area, wherein the internal register stores data necessary for configuration of a respective data path by the port connection control unit.

11. The device of claim 10, wherein the internal register comprises a semaphore area storing data indentifying control authority over the shared memory area, a first mailbox area storing message data communicated from the first processor to the second processor, and a second mailbox area storing message data communicated from the second processor to the first processor.

12. The system of claim 11, wherein when the internal register is addressed, memory cells coupled to a specific word line associated with the shared memory area are disabled.

13. A multiport semiconductor memory device comprising:
   first and second port units respectively coupled to first and second processors;
   a first dedicated memory area accessed by only the first processor via the first port unit and implemented using Dynamic Random Access Memory (DRAM) cells;
   a second dedicated memory area accessed by only the second processor via the second port unit and implemented using DRAM cells;
   a shared memory area commonly accessed by the first and second processors via respective first and second port units and implemented using Static Random Access Memory (SRAM);
   a port connection control unit configured to generate a path control signal; and
   a switching unit adapted to configure a data path between the shared memory area and one of the first and second port units corresponding to one of the first and second processors having a control authority over the shared memory area as indicated by the port connection control unit.

14. A method by which first and second processor access data stored in a multiport semiconductor memory device, the method comprising:
   executing a first task using the first processor while executing a second task different from the first task using the second processor;
   during execution of the first task, the first processor accesses data stored in a first memory area dedicated solely to the use of the first processor via a first port unit, wherein the first memory area is implemented using Dynamic Random Access Memory (DRAM) cells;
   during execution of the second task, the second processor accesses data stored in a second memory area dedicated solely to the use of the second processor via a second port unit, wherein the second memory area is implemented DRAM cells;
   during execution of the first task, the first processor using the first port unit accesses data stored in a shared memory area, wherein the shared memory area is implemented using Static Random Access Memory (SRAM) cells, and during execution of the second task, the second processor using the second port unit accesses data stored in the shared memory area;
   at any given time, controlling configuration of respective data paths between the shared memory area and the first and second port units, such that only one of the first and second processor is able to access data stored in the shared memory area by respectively using a first interface unit coupled to the shared memory area to connect the first port unit with the shared memory area, or a second interface unit coupled to the shared memory area to connect the second port unit with the shared memory area, wherein each one of the first and second interface units converts DRAM address/data compatible with data storage in the first and second dedicated memory areas into SRAM address/data compatible with data storage in the shared memory area.

15. The method of claim 14, wherein the first processor is a communication processor and the second processor is an application processor.

* * * * *